(12) United States Patent
Patton, III et al.

(10) Patent No.: US 8,498,172 B1
(45) Date of Patent: Jul. 30, 2013

(54) DATA STORAGE DEVICE EVALUATING FREQUENCY RANGE OF SUPPLY VOLTAGE TO DETECT POWER FAILURE

(75) Inventors: Charles R. Patton, III, Murrieta, CA (US); Norman D. Gardner, Mission Viejo, CA (US)

(73) Assignee: Western Digital Technologies, Inc., Irvine, CA (US)

( * ) Notice: Subject to any disclaimer, the term of this patent is extended or adjusted under 35 U.S.C. 154(b) by 198 days.

(21) Appl. No.: 13/190,533

(22) Filed: Jul. 26, 2011

Related U.S. Application Data

(60) Provisional application No. 61/378,888, filed on Aug. 31, 2010.

(51) Int. Cl.
*G11C 5/14* (2006.01)
(52) U.S. Cl.
USPC .................................. 365/226; 365/189.07
(58) Field of Classification Search
USPC ............................................. 365/226, 189.07
See application file for complete search history.

(56) References Cited

U.S. PATENT DOCUMENTS

| | | | |
|---|---|---|---|
| 4,260,907 A | 4/1981 | Winebarger | |
| 4,375,663 A | 3/1983 | Arcara et al. | |
| 4,516,214 A | 5/1985 | Ray | |
| 4,713,553 A | 12/1987 | Townsend et al. | |
| 4,736,151 A | 4/1988 | Dishner | |
| 5,079,688 A | 1/1992 | Kido | |
| 5,140,509 A | 8/1992 | Murugan | |
| 5,198,942 A | 3/1993 | Iizuka et al. | |
| 5,359,280 A | 10/1994 | Canter et al. | |
| 5,636,108 A | 6/1997 | Taurand | |
| 5,668,703 A | 9/1997 | Rossi et al. | |
| 5,745,351 A | 4/1998 | Taurand | |
| 6,069,804 A | 5/2000 | Ingman et al. | |
| 6,268,666 B1 | 7/2001 | Bhowmik | |
| 6,717,388 B2 | 4/2004 | Smidt et al. | |
| 6,765,315 B2 | 7/2004 | Hammerstrom et al. | |
| 6,765,370 B2 | 7/2004 | Bradley | |
| 6,895,521 B2 | 5/2005 | Dossey et al. | |
| 7,038,522 B2 | 5/2006 | Fauh et al. | |
| 7,126,857 B2 | 10/2006 | Hajeck | |
| 7,142,400 B1 | 11/2006 | Williams et al. | |
| 7,161,331 B2 | 1/2007 | Wai et al. | |
| 7,362,601 B2 | 4/2008 | Uematsu | |
| 7,382,113 B2 | 6/2008 | Wai et al. | |
| 7,394,757 B2 * | 7/2008 | Barzegar et al. | 370/217 |
| 7,433,207 B2 | 10/2008 | Thor et al. | |
| 7,623,316 B1 | 11/2009 | Rana et al. | |
| 2008/0111423 A1 | 5/2008 | Baker et al. | |

(Continued)

OTHER PUBLICATIONS

Andy Gardner, Linear Technology Design Notes, "LTC1646: Power Supply Isolation Controller Simplifies Hot Swapping the CompactPCI Bus for 5V-13.3V-Only Applications", Design Note 253, 2 pages.

*Primary Examiner* — Son Dinh

(57) ABSTRACT

A data storage device (DSD) is disclosed comprising a non-volatile memory (NVM), such as a disk or non-volatile semiconductor memory, and control circuitry for detecting a power failure condition. A frequency range of a supply voltage from a first frequency to a second frequency is extracted, wherein the first frequency is greater than ten hertz, the second frequency is higher than the first frequency, and the second frequency is less than one megahertz. The power failure condition is detected in response to the extracted frequency range of the supply voltage.

25 Claims, 4 Drawing Sheets

U.S. PATENT DOCUMENTS

2008/0244311 A1 10/2008 Elliott et al.
2009/0027819 A1 1/2009 Priel et al.
2010/0008175 A1 1/2010 Sweere et al.
2010/0053796 A1 3/2010 Boyle et al.
2010/0066431 A1 3/2010 Carter

* cited by examiner

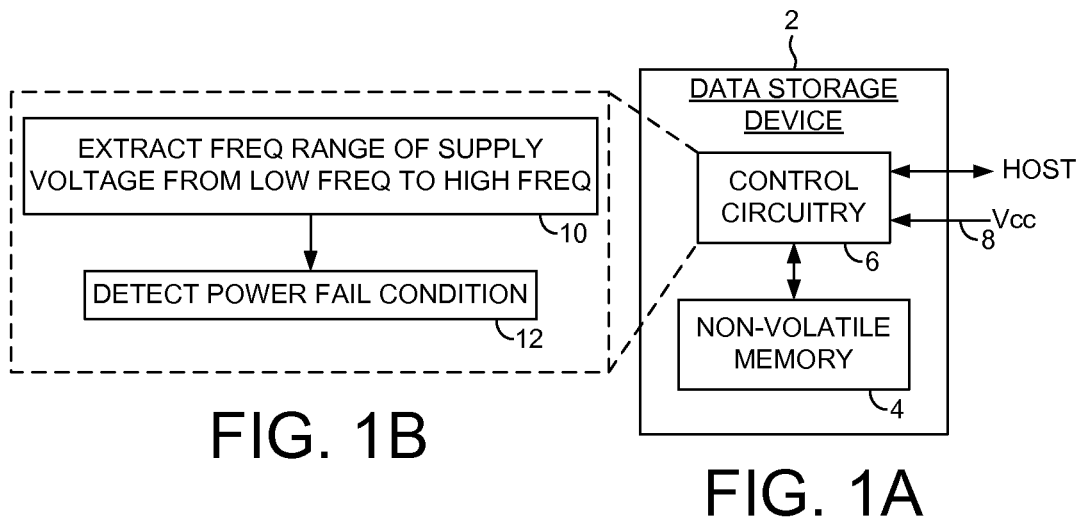
FIG. 1B
FIG. 1A
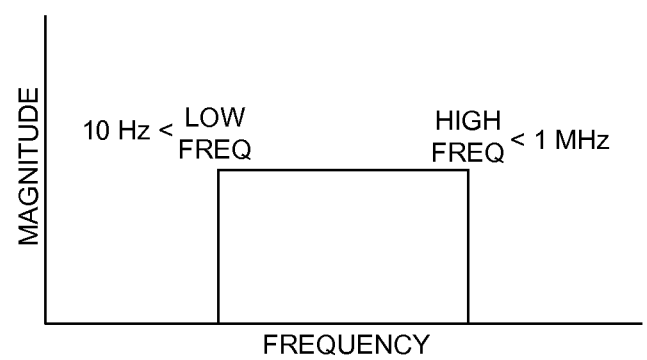
FIG. 1C

US 8,498,172 B1

DATA STORAGE DEVICE EVALUATING FREQUENCY RANGE OF SUPPLY VOLTAGE TO DETECT POWER FAILURE

CROSS-REFERENCE TO RELATED APPLICATIONS

The present application claims priority from provisional U.S. Patent Application Ser. No. 61/378,888, filed on Aug. 31, 2010, the specification of which is incorporated herein by reference.

BACKGROUND

Data storage devices, such as disk drives and solid state drives are employed in numerous areas such as computer systems (e.g., desktops, laptops, portables, etc.) and consumer devices (e.g., music players, cell phones, cameras, etc.). User data is typically stored in a non-volatile memory, such as a magnetic disk or a non-volatile semiconductor memory (e.g., Flash memory). It is desirable to detect as soon as possible when a power failure occurs so that protective action can be taken, such as flushing cached data to the non-volatile memory and/or parking a head on a ramp.

BRIEF DESCRIPTION OF THE DRAWINGS

FIG. 1A shows a data storage device (DSD) according to an embodiment of the present invention comprising a non-volatile memory and control circuitry.

FIG. 1B shows a flow diagram executed by the control circuitry for detecting a power failure condition by evaluating a frequency range of a supply voltage.

FIG. 1C shows an embodiment of the present invention including the frequency range of the supply voltage evaluated to detect the power failure condition.

DETAILED DESCRIPTION OF EMBODIMENTS OF THE INVENTION

FIG. 1A shows a data storage device (DSD) 2 according to an embodiment of the present invention comprising a non-volatile memory (NVM) 4, such as a disk or non-volatile semiconductor memory, and control circuitry 6 for detecting a power failure condition by executing the flow diagram of FIG. 1B. A frequency range of a supply voltage 8 from a first frequency to a second frequency is extracted (step 10), wherein the first frequency is greater than ten hertz, the second frequency is higher than the first frequency, and the second frequency is less than one megahertz (FIG. 1C). The power failure condition is detected in response to the extracted frequency range of the supply voltage (step 12).

Figure 2A:
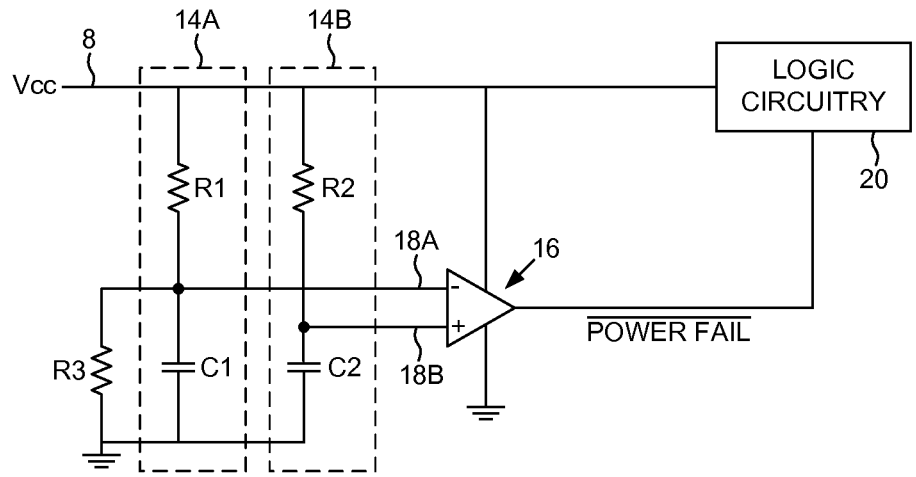
FIG. 2A shows control circuitry for detecting the power failure condition by filtering the supply voltage with a first and second resistor/capacitor networks that determine the frequency range according to an embodiment of the present invention.

Any suitable control circuitry may be employed in the embodiments of the present invention to extract the frequency range from the supply voltage. FIG. 2A shows an embodiment of the present invention wherein the control circuitry comprises a first resistor/capacitor network 14A and a second resistor/capacitor network 14B, wherein the first and second resistor/capacitor networks determine the frequency range. Also in the embodiment of FIG. 2A, the control circuitry comprises a voltage divider (R1/R3) for dividing the supply voltage 8. A comparator 16 compares a first voltage 18A generated by the first resistor/capacitor network 14A to a second voltage 18B generated by the second resistor/capacitor network 14B, wherein the power failure condition 18 is detected (active low) when the first voltage 18A exceeds the second voltage 18B.

Figure 2B:
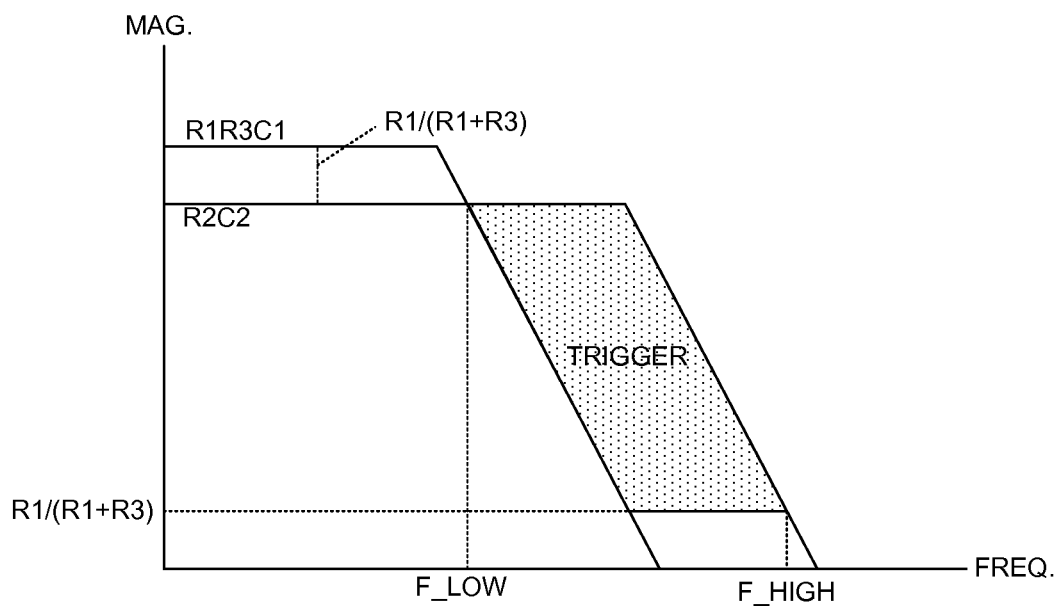
FIG. 2B illustrates how the control circuitry of FIG. 2A operates to set the low frequency cutoff and the high frequency cutoff according to an embodiment of the present invention.

In the embodiment of FIG. 2A, the values selected for the voltage divider (R1/R3) and the first and second resistor/capacitor networks 14A and 14B determine the first (low) frequency cutoff (F_LOW) and the second (high) frequency cutoff (F_HIGH) of the control circuitry. This is illustrated in FIG. 2B which shows the frequency response of the first resistor/capacitor network (R1R3C1) 14A and the frequency response of the second resistor/capacitor network (R2C2) 14B. FIG. 2B assumes a constant magnitude transient (e.g., a pulse) that varies in duration (frequency). As the magnitude of the transient varies, the cutoff frequencies F_LOW and F_HIGH will vary.

Evaluating a frequency range of the supply voltage 8 in order to detect the power failure condition helps ensure a power failure is detected quickly without detecting false conditions at lower and higher frequencies. For example if the supply voltage 8 experiences a fast transient, a power failure condition will not be detected since it is likely caused by something other than a power failure, such as electrical noise. Similarly, if the supply voltage 8 experiences a slow transient, a power failure condition will not be detected since it is also likely caused by something other than a power failure, such as fluctuations in the power source. When a power failure condition is detected, logic circuitry 20 (e.g., a microprocessor or state machine) may take protective action, such as flushing cached data to the NVM 4 or parking a head on a ramp.

Figure 2C:
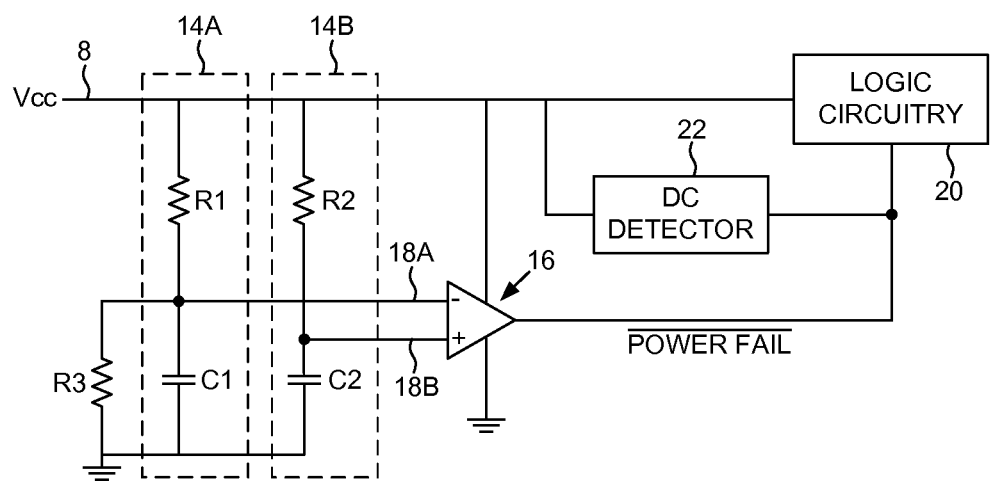
FIG. 2C shows control circuitry further comprising a direct current (DC) level detector for detecting the power failure condition in response to a substantially DC component of the supply voltage according to an embodiment of the present invention.
Figure 2D:
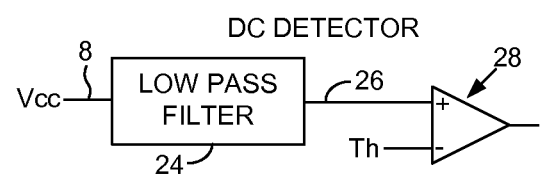
FIG. 2D shows an embodiment of the present invention wherein the DC detector compares a low frequency component of the supply voltage to a threshold.

In one embodiment, a power failure condition may occur at a rate too slow for the control circuitry of FIG. 2A to detect (i.e., in the frequency range below the first frequency of FIG. 1C). Accordingly, in an embodiment shown in FIG. 2C the control circuitry further comprises a direct current (DC) level detector 22 for detecting the power failure condition in response to a substantially DC component of the supply voltage 8. In this manner, if the DC level of the supply voltage falls too much, a power failure condition is detected regardless as to the rate of change of the supply voltage. In an embodiment of shown in FIG. 2D, the DC level detector 22 comprises a low pass filter 24 for extracting a low frequency component 26 of the supply voltage 8 which is compared 28 to a threshold. When the low frequency component 26 falls below the threshold, the power failure condition is detected (active low).

Figure 3:
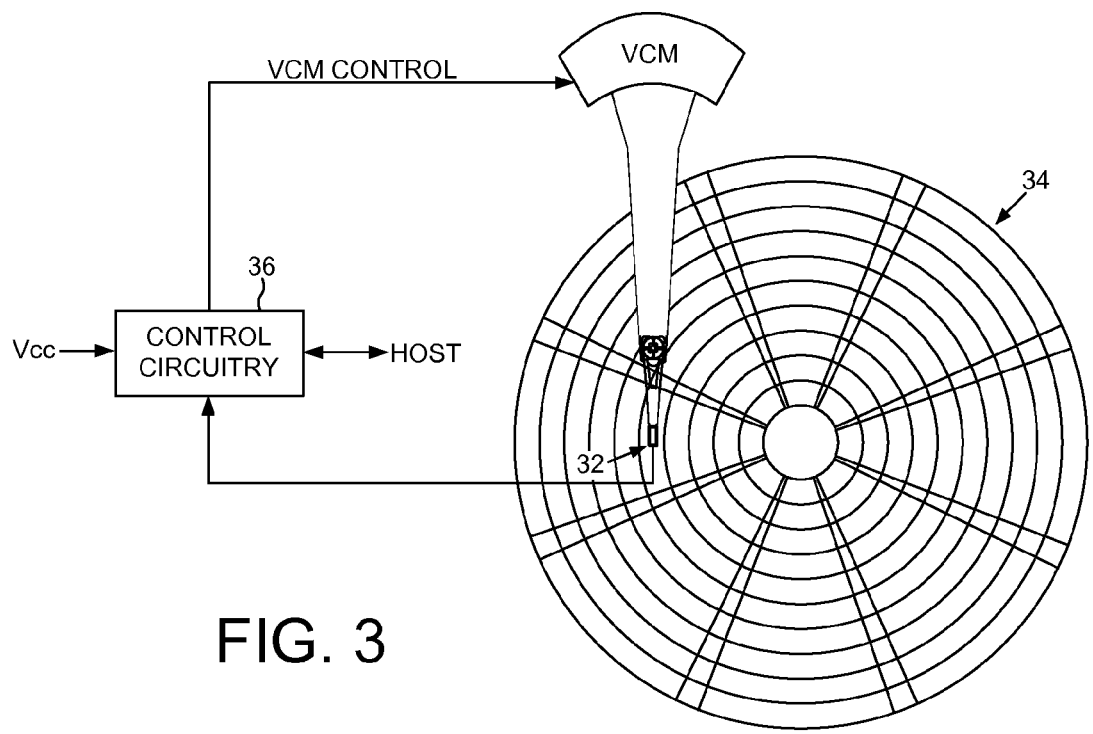
FIG. 3 shows an embodiment of the present invention wherein the non-volatile memory of the DSD comprises a disk.
Figure 4:
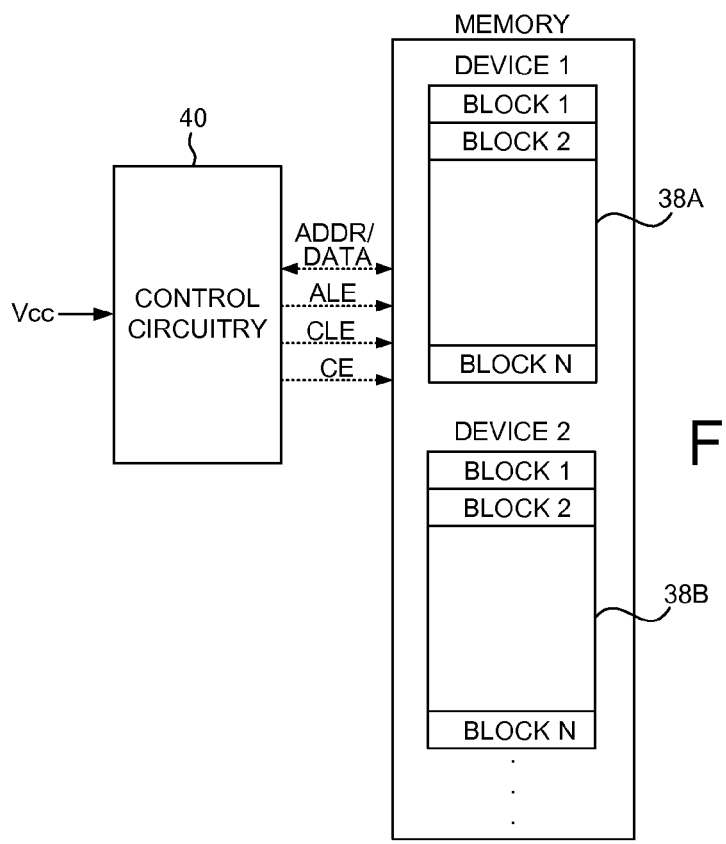
FIG. 4 shows an embodiment of the present invention wherein the non-volatile memory of the DSD comprises a non-volatile semiconductor memory.

The embodiments of the present invention may be employed in any suitable DSD comprising any suitable non-volatile memory. FIG. 3 shows a DSD comprising a disk drive including a head 32 actuated over a disk 34 and control circuitry 36 including an embodiment of the power circuit described herein. FIG. 4 shows a DSD comprising a solid state drive including a plurality of non-volatile semiconductor memories 38A, 38B, etc., such as flash memories, and control circuitry 40 including an embodiment of the power circuit described herein. A hybrid DSD may also be employed comprising components of a disk drive shown in FIG. 3 combined with the non-volatile semiconductor memories shown in FIG. 4.

What is claimed is:

1. A data storage device (DSD) comprising:
a non-volatile memory (NVM); and
control circuitry operable to:
receive a supply voltage;
extract a frequency range of the supply voltage from a first frequency to a second frequency, wherein:
the first frequency is greater than ten hertz;
the second frequency is higher than the first frequency; and
the second frequency is less than one megahertz; and
detect a power failure condition in response to the extracted frequency range of the supply voltage.

2. The data storage device as recited in claim 1, wherein:
the control circuitry comprises a first resistor/capacitor network and a second resistor/capacitor network; and
the first and second resistor/capacitor networks determine the frequency range.

3. The data storage device as recited in claim 2, wherein the control circuitry further comprises a voltage divider for dividing the supply voltage.

4. The data storage device as recited in claim 2, wherein the control circuitry further comprises a comparator for comparing a first voltage generated by the first resistor/capacitor network to a second voltage generated by the second resistor/capacitor network.

5. The data storage device as recited in claim 4, wherein the power fail condition is detected when the first voltage exceeds the second voltage.

6. The data storage device as recited in claim 1, wherein the control circuitry further comprises a direct current (DC) level detector for detecting the power failure condition in response to a substantially DC component of the supply voltage.

7. The data storage device as recited in claim 6, wherein the DC level detector comprises:
a low pass filter for extracting a low frequency component of the supply voltage; and
a comparator for comparing the low frequency component to a threshold.

8. The data storage device as recited in claim 1, wherein the NVM comprises a disk.

9. The data storage device as recited in claim 1, wherein the NVM comprises a non-volatile semiconductor memory.

10. A method of operating a data storage device (DSD), the DSD comprising a non-volatile memory (NVM), the method comprising:
receiving a supply voltage;
extracting a frequency range of the supply voltage from a first frequency to a second frequency, wherein:
the first frequency is greater than ten hertz;
the second frequency is higher than the first frequency; and
the second frequency is less than one megahertz; and
detecting a power failure condition in response to the extracted frequency range of the supply voltage.

11. The method as recited in claim 10, further comprising detecting the power failure condition by filtering the supply voltage with a first and second resistor/capacitor networks that determine the frequency range.

12. The method as recited in claim 11, further comprising detecting the power failure condition by dividing the supply voltage.

13. The method as recited in claim 11, further comprising comparing a first voltage generated by the first resistor/capacitor network to a second voltage generated by the second resistor/capacitor network.

14. The method as recited in claim 13, further comprising detecting the power fail condition when the first voltage exceeds the second voltage.

15. The method as recited in claim 10, further comprising detecting the power failure condition in response to a substantially DC component of the supply voltage.

16. The method as recited in claim 15, further comprising detecting the power failure condition by:
extracting a low frequency component of the supply voltage; and
comparing the low frequency component to a threshold.

17. The method as recited in claim 10, wherein the NVM comprises a disk.

18. The method as recited in claim 10, wherein the NVM comprises a non-volatile semiconductor memory.

19. A power circuit operable to:
receive a supply voltage;
extract a frequency range of the supply voltage from a first frequency to a second frequency, wherein:
the first frequency is greater than ten hertz;
the second frequency is higher than the first frequency; and
the second frequency is less than one megahertz; and
detect a power failure condition in response to the extracted frequency range of the supply voltage.

20. The power circuit as recited in claim 19, wherein:
the power circuit comprises a first resistor/capacitor network and a second resistor/capacitor network; and
the first and second resistor/capacitor networks determine the frequency range.

21. The power circuit as recited in claim 20, further comprising a voltage divider for dividing the supply voltage.

22. The power circuit as recited in claim 20, further comprising a comparator for comparing a first voltage generated by the first resistor/capacitor network to a second voltage generated by the second resistor/capacitor network.

23. The power circuit as recited in claim 22, wherein the power fail condition is detected when the first voltage exceeds the second voltage.

24. The power circuit as recited in claim 19, further comprising a direct current (DC) level detector for detecting the power failure condition in response to a substantially DC component of the supply voltage.

25. The power circuit as recited in claim 24, wherein the DC level detector comprises:
a low pass filter for extracting a low frequency component of the supply voltage; and
a comparator for comparing the low frequency component to a threshold.

* * * * *